United States Patent
Seo et al.

(10) Patent No.: US 7,782,701 B2
(45) Date of Patent: Aug. 24, 2010

(54) POWER GATING CIRCUIT, SYSTEM ON CHIP CIRCUIT INCLUDING THE SAME AND POWER GATING METHOD

(75) Inventors: Dong-Wook Seo, Yongin-si (KR); Jong-Hoon Jung, Seongnam-si (KR); In-Gyu Park, Seoul (KR); Chan-Ho Lee, Hwaseong-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 351 days.

(21) Appl. No.: 11/846,677

(22) Filed: Aug. 29, 2007

(65) Prior Publication Data

US 2008/0056048 A1 Mar. 6, 2008

(30) Foreign Application Priority Data

Sep. 6, 2006 (KR) .................. 10-2006-0085417

(51) Int. Cl.
*G11C 5/14* (2006.01)
(52) U.S. Cl. .................. 365/226; 365/227; 365/228; 365/229
(58) Field of Classification Search .................. 365/226, 365/227, 228, 239, 229
See application file for complete search history.

(56) References Cited

U.S. PATENT DOCUMENTS 6,498,762 B2 * 12/2002 Noda et al. .................. 365/227

FOREIGN PATENT DOCUMENTS

| JP | 2005-086805 | 3/2005 |
| JP | 2005-196929 | 7/2005 |
| KR | 1999-006009 | 1/1999 |

* cited by examiner

*Primary Examiner*—Pho M Luu
*Assistant Examiner*—Tha-O Bui
(74) *Attorney, Agent, or Firm*—F. Chau & Associates, LLC

(57) ABSTRACT

A power gating circuit of a memory device includes a power gating unit and a control unit. The power gating unit includes first, second, and third power gating transistors connected in parallel between a power supply voltage and an internal power supply voltage bus of the memory device. The three power gating transistors are sequentially turned ON. The second and third power gating transistors turn ON sequentially in response to the increasing voltage level of the bus. The timing points when the second and third power gating transistors are sequentially turned ON is based upon detecting the gradually increasing the voltage level of the internal power supply voltage. The size of the first power gating transistor may be smaller than the size of the second power gating transistor, and the size of the second power gating transistor may be smaller than the size of the third power gating transistor.

17 Claims, 6 Drawing Sheets

POWER GATING CIRCUIT, SYSTEM ON CHIP CIRCUIT INCLUDING THE SAME AND POWER GATING METHOD

CROSS-REFERENCE TO RELATED APPLICATIONS

This application claims priority under, 35 USC § 119, to Korean Patent Application No. 2006-0085417, filed on Sep. 6, 2006 in the Korean Intellectual Property Office (KIPO), which is incorporated by reference herein in its entirety.

BACKGROUND OF THE INVENTION

1. Field of the Invention

The present invention relates to a memory device, and more particularly to a power gating circuit of a memory device, a system-on-a-chip (SoC) circuit including the power gating circuit, and a power gating circuit method for reducing a peak current.

2. Description of the Related Art

A typical system-on-a-chip (SoC) circuit consists of one or more microcontroller, microprocessor or DSP cores, memory blocks a ROM and a RAM, timing sources including oscillators and phase-locked loops, voltage regulators and power management circuits. When electric power is applied to a memory device included in a system-on-a-chip circuit, a relatively large current may flow. The large current flows produce heat and may have adversely affect adjacent logic circuits, thereby degrading performance of the system-on-a-chip circuit.

FIG. 1 is a block diagram illustrating a conventional power gating circuit.

Referring to FIG. 1, the conventional power gating circuit includes a power control pin 120 and power gating transistors 130, 140, 150, and 160 that are connected to a power supply voltage (VDD). The power gating transistors 130, 140, 150, and 160 are simultaneously turned ON responding to a power control signal that is applied to the power control pin 120, and thus provide the power supply voltage to a memory device 110. Since the power gating transistors 130, 140, 150, and 160 are all turned ON at the same time, a peak current that is applied to the memory device 110 can be increased abruptly. If the peak current flowing into the memory device 110 is abruptly increased, the current (power) available for operations of the adjacent logic circuits may be limited such that the adjacent logic circuits may operate abnormally.

SUMMARY OF THE INVENTION

An aspect of the present invention provides a power gating method for reducing the peak current that is applied to the memory device.

Some exemplary embodiments of the present invention provide a power gating circuit capable of reducing a peak current that is applied to a memory device.

Some exemplary embodiments of the present invention provide a system-on-a-chip circuit including a power gating circuit capable of reducing a peak current that is applied to a memory device.

Some exemplary embodiments of the present invention provide a power gating method for reducing a peak current that is applied to a memory device.

In some exemplary embodiments of the present invention, a power gating circuit of a memory device includes a power gating unit that includes three (first, second and third) power gating transistors, connected between a power supply voltage and an internal power supply voltage bus connected to the memory device, that are sequentially turned ON. The first power gating transistor is turned ON first, in response to a control signal, and gradually establishes a first intermediate voltage on the bus. Next, the second transistor is sequentially turned ON in response to the first intermediate voltage established on the bus, and establishes a second intermediate voltage on the bus. And finally, the third power gating transistor is sequentially turned ON in response to the second intermediate voltage established on the bus, and establishes the full power supply voltage on the bus. The power gating circuit may further comprise a control unit that controls the power gating transistors based on the control signal and upon voltage of the bus, and that controls the timing points when the second and third power gating transistors are sequentially turned ON by gradually increasing the voltage level of the internal power supply voltage bus.

Each of the first power gating transistor, the second power gating transistor, and the third power gating transistor may be a PMOS transistor. The size of the first power gating transistor may be smaller than the size of the second power gating transistor, and the size of the second power gating transistor may be smaller than the size of the third power gating transistor. The control unit may include a first NAND-gate configured to control the second power gating transistor and a second NAND-gate configured to control the third power gating transistor. The logic threshold voltage of an input of the first NAND-gate may be lower than the logic threshold voltage of an input of the second NAND-gate.

The gate of the first power gating transistor may directly receives a power-down enable signal, and its source may be directly connected to the power supply voltage, and its drain may be directly connected to the internal power supply voltage bus and to the memory device. The first NAND-gate may perform a logical NAND operation upon the internal power supply voltage and upon an inverted power-down enable signal. The gate of the second power gating transistor may be directly connected to the output of the first NAND-gate. The source of the second power gating transistor may be directly connected to the power supply voltage VDD, and the drain of the second power gating transistor may be directly connected to the internal power supply voltage bus. The second NAND-gate may perform a logical NAND operation upon the internal power supply voltage and upon the inverted power-down enable signal. The gate of the third power gating transistor may be directly connected to the output of the second NAND-gate, and the source of the third power gating transistor may be directly connected to the power supply voltage VDD, and the drain of the third power gating transistor may be directly connected to the internal power supply voltage bus.

Each one of the first and second NAND-gates includes a first PMOS transistor, a second PMOS transistor, a first NMOS transistor, and a second NMOS transistor. In each of the first and second NAND-gates, the first PMOS transistor and the second PMOS transistor may be connected in parallel between the power supply voltage VDD and the output of the NAND-gate, and the first NMOS transistor and the second NMOS transistor may be connected in series the output of the NAND-gate and a ground voltage.

The gate of the first PMOS transistor in each of the first and second NAND-gates may be directly connected to (or indirectly controlled by) the internal power supply voltage bus. The gate of the second PMOS transistor may be directly connected to (or indirectly controlled by) the inverted power-down enable signal. The gate of the first NMOS transistor may be directly connected to (or indirectly controlled by) the internal power supply voltage. The second NMOS transistor may be directly connected to (or indirectly controlled by) the inverted power-down enable signal. Thus, each of the each of the first and second NAND-gates is configured to perform a logical NAND operation upon the internal power supply voltage INTVDD and upon the inverted power-down enable signal, and provides the NAND output (at a logic high level equal to VDD) to control the gate of a respective one of the second and third power gating transistors.

The first NAND-gate may be a conventional four-transistor NAND-gate configured to perform a logical NAND operation upon the internal power supply voltage INTVDD and upon the inverted power-down enable signal. The second NAND-gate may additionally include a third NMOS transistor and a fourth NMOS transistor connected in series with the first and second NMOS transistor second NAND-gate, between the output of the second NAND-gate and the ground voltage.

The gate of the third NMOS transistor may both be directly connected to (or indirectly controlled by) the voltage INTVDD of the internal power supply voltage (bus). Likewise, the gate of the fourth NMOS transistor may both be directly connected to (or indirectly controlled by) the voltage INTVDD of the internal power supply voltage (bus).

The addition of the third NMOS transistor and the fourth NMOS transistor in the pull-down stack of the second NAND-gate tends to increase the logic threshold voltage of the input of the second NAND-gate that receives the voltage INTVDD of internal power supply voltage bus. Thus, the while the voltage INTVDD on the internal power supply voltage bus gradually increases with current flowing through the first (smallest) power gating transistor, the timing of the activation (turn-ON) of the third power gating transistor will occur after the activation (turn-ON) of the second power gating transistor.

In some exemplary embodiments of the present invention, a power gating circuit includes a terminal to which a power supply voltage VDD is applied, a bus that provides an internal power supply voltage to a memory device. The power gating unit may include three power gating transistors, connected between the power supply voltage VDD and the bus, that are sequentially turned ON. The second and third power gating transistors are turned ON in response to the voltage level established on the internal power supply voltage by current flowing through the first power gating transistor (previously turned ON). A control unit connected to the bus controls the second and third power gating transistors, and controls the timing points when each of the second and third power gating transistors are sequentially turned ON, based on gradually increasing the voltage level of the bus.

In some exemplary embodiments of the present invention, a system-on-a-chip includes a memory device, and other devices (e.g., so-called intellectual property circuits that perform each predetermined functions), and a power control unit that is connected to the memory device and the other devices, and that controls a power that is supplied to the memory device and the devices. The power control unit includes a power gating unit that includes first, second and third power gating transistors that are sequentially turned ON, gradually increasing the voltage level of the bus. The second and third power gating transistors are turned ON sequentially in response to the gradually rising voltage level on a bus carrying an internal power supply voltage that is applied to the memory device. A control unit connected to the internal power supply voltage bus controls the second and third power gating transistors, and controls the timing point when the second and third power gating transistors are sequentially turned ON based on gradually increasing the voltage level on the internal power supply voltage bus.

In some exemplary embodiments of the present invention, a power gating method for reducing a peak current includes gradually increasing the voltage level of an internal power supply voltage bus to sequentially turn ON second and third power gating transistors that are connected between a power supply voltage and the bus, and using logic gates to control the timing points when the second and third power gating transistors are turned ON.

The sizes of the first, second and third power gating transistors may be different from each other. The timing point when the second and third power gating transistors are sequentially turned ON may be controlled by varying the logic threshold voltages of first and second NAND-gates that are connected to turn ON the first and second power gating transistors. The logic threshold voltage of the second NAND-gate may be higher than the logic threshold voltage of the first NAND-gate, so that the first NAND-gate activates the second power gating transistor before the second NAND-gate activates the third power gating transistor.

Therefore, accordingly a power gating circuit, a system-on-a-chip circuit which includes the power gating circuit, and a power gating method can disperse the peak current by turning ON three power gating transistors one after the other based on gradually increasing the voltage level on an internal power supply voltage bus. The gradual increase of the voltage level on the internal power supply voltage bus can reduce the influence of the peak current on adjacent intellectual properties. The term "intellectual properties" refers to devices made on a chip from plans selected from a library of pre-designed system level cores to accelerate the development process and to meet rapid product development schedules.

The principles of the present invention will be described more fully below with reference to the accompanying drawings, in which exemplary embodiments of the invention are shown. This invention may, however, be embodied in many different forms and should not be construed as limited to the exemplary embodiments set forth herein. Rather, the exemplary embodiments are provided so that this disclosure will be thorough and complete, and will fully convey the scope of the invention to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. However, it will be understood that when the terms "first", "second", third are employed to identify a time/sequence of events, the first event will begin before the second event, and the second event will begin before the third.

It will be understood that when an element is referred to as being "connected" or "coupled" to or "controlled" by another element, it can be directly connected or coupled to or controlled by the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise.

BRIEF DESCRIPTION OF THE DRAWINGS

The above and other features of the present invention will become more apparent to persons skilled in the art by describing in detail exemplary embodiments thereof with reference to the attached drawings in which.

DETAILED DESCRIPTION OF EXEMPLARY EMBODIMENTS OF THE INVENTION

Figure 2:
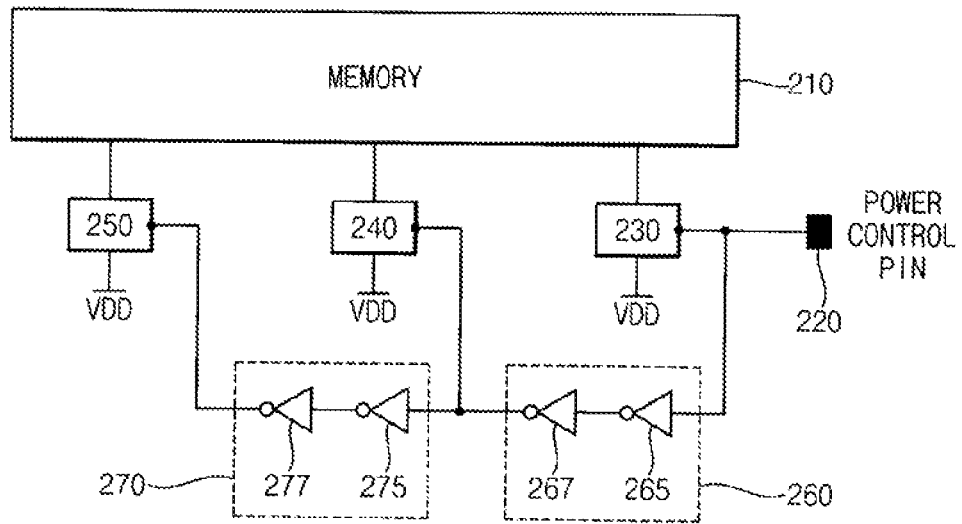
FIG. 2 is a block diagram illustrating a power gating circuit for a memory device including an inverter delay chain.

FIG. 2 is a block diagram illustrating a power gating circuit for a memory device 210 including an inverter delay chain 260 and 270.

Referring to FIG. 2, the power gating circuit includes a power control pin 220, power gating transistors 230, 240 and 250, a first inverter delay chain 260, and a second inverter delay chain 270. The first inverter delay chain 260 includes inverters 265 and 267. The second inverter delay chain 270 includes inverters 275 and 277.

When the first power gating transistor 230 is turned ON by a power control signal that is applied to the power control pin 220, a power supply voltage VDD is applied to a first pin of the memory device 210. When the second power gating transistor 240 is turned ON by the power control signal that is delayed through the first inverter chain 260, the power supply voltage VDD is applied to the first and second pin of the memory device 210. When the third power gating transistor 250 is turned ON by the power control signal that is delayed through the first inverter chain 260 and through the second inverter chain 270, the power supply voltage VDD is applied to first, second and third pin of the memory device 210. Thus, in the power gating circuit of FIG. 2, the power gating transistors 230, 240, and 250 can be turned ON one after the other by using the inverter delay chains 260 and 270. However, the power gating circuit of FIG. 2 that uses the inverter delay chains 260 and 270 has some disadvantages.

A voltage level of an internal power supply voltage is increased gradually as the power gating transistors 230, 240, and 250 are turned ON one after the other for reducing the peak current. In this case, the first power gating transistor 230 turned ON first is most influenced by the peak current. The second and third power gating transistors 240 and 250 turned ON next are less influenced by the peak current than the first power gating transistor 230 because the voltage difference between the source and the drain of second and third power gating transistors 240 and 250 will have been reduced by the power gating transistor 230 turned ON first. Therefore, the peak current may be reduced when increasing the power.

In order to turn ON the power gating transistors 230, 240, and 250 one after the other, Inverters 265, 267, 275, and 277 included in the inverter chains 260 and 270 need to provide enough delay. Thus, the size of the inverters needs to be large. Otherwise, longer inverter chains are needed to provide more delay. Therefore, a system-on-a-chip circuit including a memory device may be large, or an occupation area of the memory device may become larger. In addition, the leakage current that flows through each inverter in the inverter chains may increase power consumption. Accordingly, the power gating circuit including the inverter delay chains has some disadvantages such as larger size and greater leakage current.

Figure 3:
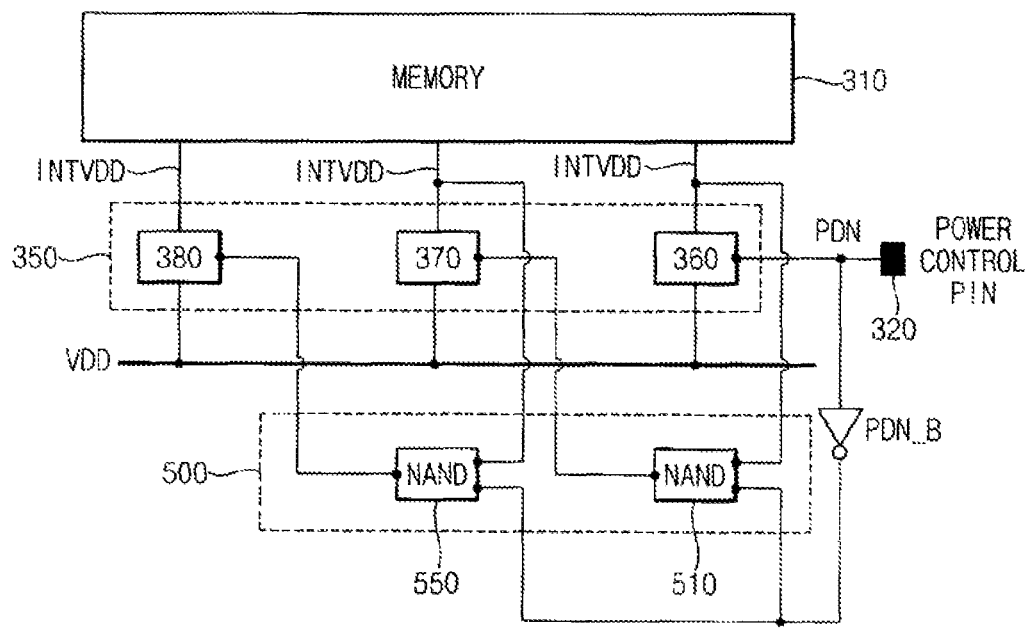
FIG. 3 is a block diagram illustrating a power gating circuit for a memory device according to an exemplary embodiment of the present invention.

FIG. 3 is a block diagram illustrating a power gating circuit for a memory device 310 according to an exemplary embodiment of the present invention.

Referring to FIG. 3, the power gating circuit includes a power gating unit 350 and a control unit 360.

The power gating unit 350 includes power gating transistors that are sequentially turned ON in response to a voltage level of an internal power supply voltage INTVDD when it is applied to the pins of the memory device 310. Here, the memory device 310 may be embedded. The power gating unit 350 in FIG. 3 includes three power gating transistors 360, 370, and 380.

The control unit 500 is connected to the internal power supply voltage INTVDD and to the power gating unit 350. The control unit 500 determines when the power gating transistors 360, 370, and 380 turn ON by gradually increasing the voltage level of the internal power supply voltage INTVDD. The control unit 500 includes two NAND-gates 510 and 550. It will be readily understood by person skilled in the art that the number of the power gating transistors and of the NAND-gates can be varied.

Figure 4:
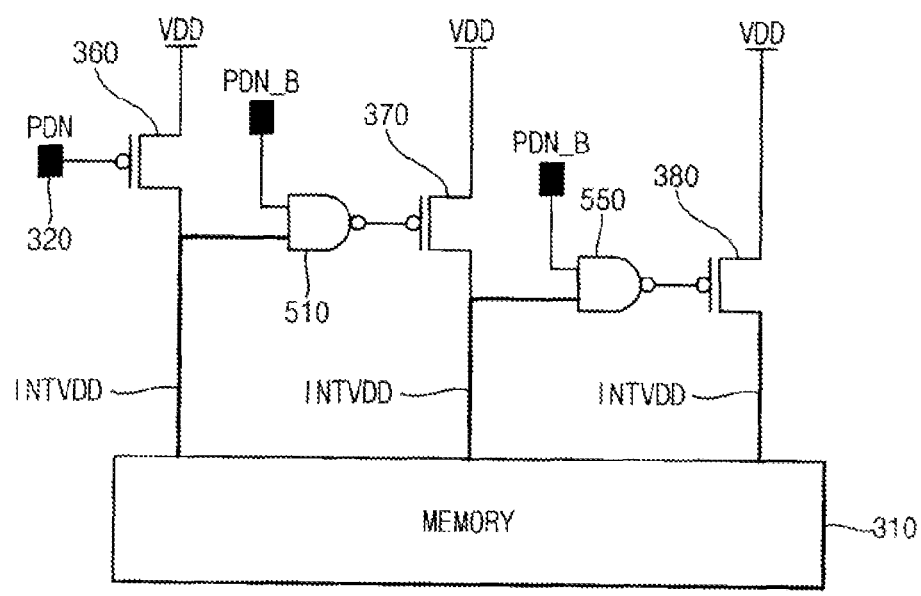
FIG. 4 is a circuit diagram of the power gating transistors in the power gating circuit of FIG. 3.

FIG. 4 is a circuit diagram of the power gating transistors included in the power gating unit 350 of FIG. 3.

Referring to FIG. 4, the power gating transistors 360, 370 and 380 included in the power gating circuit 350 may be implemented with PMOS transistors. Sizes of the power gating transistors 360, 370, and 380 are different from each other. The size of the first power gating transistor 360 may be smaller than the size of the second power gating transistor 370, and the size of the second power gating transistor 370 may be smaller than the size of the third power gating transistor 380.

Figure 5:
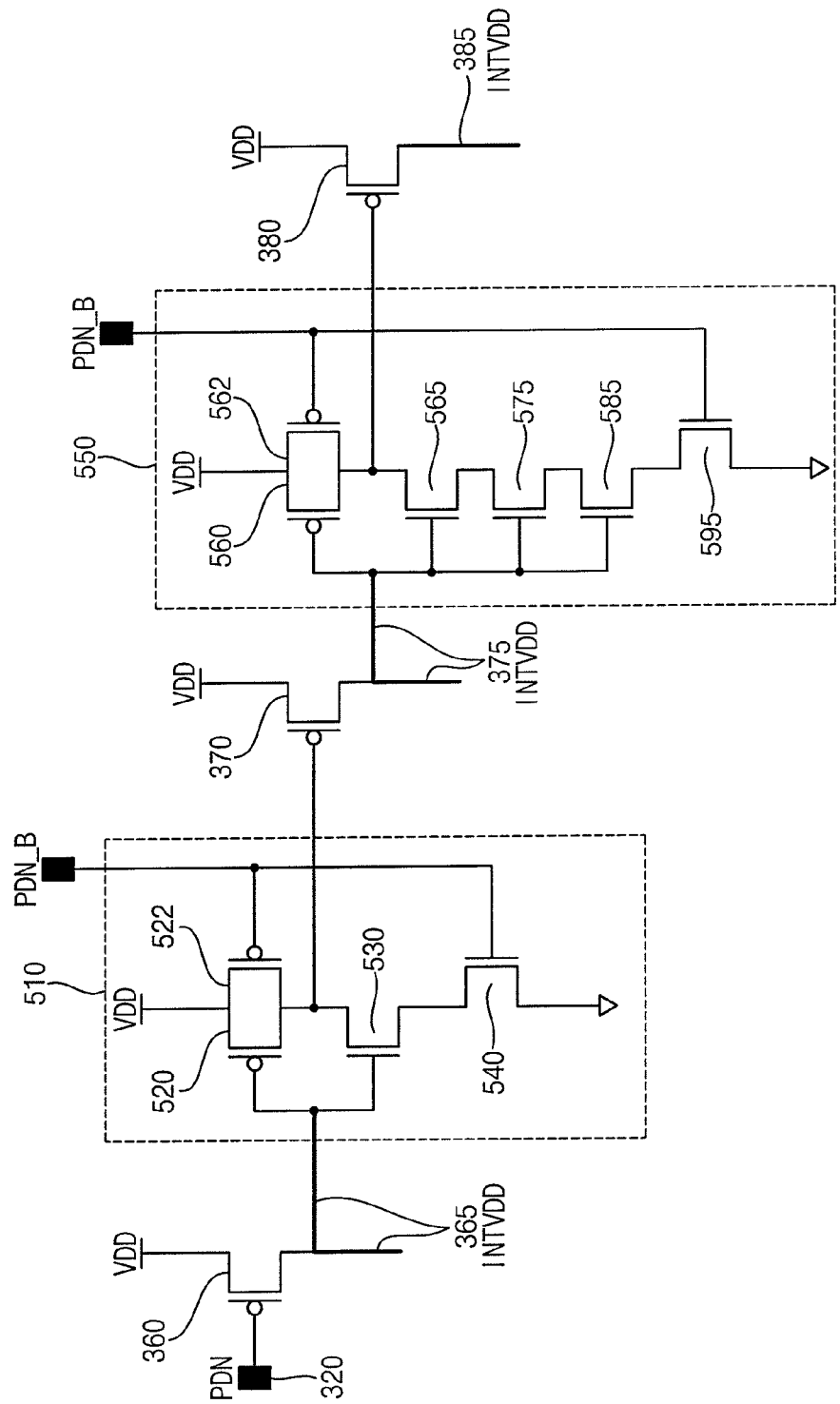
FIG. 5 is a detailed circuit diagram of the NAND-gates 510 and 550 in the control unit 500 in the power gating circuit of FIG. 3 and FIG. 4.

FIG. 5 is a block diagram illustrating structures of the NAND-gates in the control unit 500 in the power gating circuit of FIG. 3 and FIG. 4.

Referring to FIG. 5, the first NAND-gate 510 includes a first PMOS transistor 520, a second PMOS transistor 522, a first NMOS transistor 530, and a second NMOS transistor 540. The first PMOS transistor 520 and the second PMOS transistor 522 are connected to each other in parallel between the supply voltage VDD and the output node of the NAND-gate 510. The source of the first PMOS transistor 520 and the source of the second PMOS transistor 522 may be connected directly to the power supply voltage VDD. The drain of the second PMOS transistor 522 is connected to the drain of the first PMOS transistor 520.

The first NMOS transistor 530 and the second NMOS transistor 540 are connected to each other in series between the output node of the NAND-gate 510 and a ground voltage. The drain of the second NMOS transistor 540 is connected to the source of the first NMOS transistor 530. The source of the second NMOS transistor 540 is connected to a ground voltage.

The gate of the first PMOS transistor 520 and the gate of the first NMOS transistor 530 receive the internal power supply voltage INTVDD. The gate of the second PMOS transistor 522 receives an inverted signal PDN_B of a power-down enable signal PDN. The drain of the first NMOS transistor 530 is connected to the drain of the first PMOS transistor 520 and to the drain of the second PMOS transistor 522. The gate of the second NMOS transistor 540 receives the inverted signal PDN_B of the power-down enable signal PDN. The drain of the first PMOS transistor 520 and the drain of the second PMOS transistor 522 are the output node (output) of the first NAN D-gate 510 connected to the gate of a second power gating transistor 370. The first NAND-gate 510 performs a logical NAND operation upon the internal power supply voltage INTVDD and upon the inverted signal PDN_B of the power-down enable signal PDN, and provides the NAND output (at a logic high level equal to VDD) to the gate of the second power gating transistor 370.

The second NAND-gate 550 includes a first PMOS transistor 560, a second PMOS transistor 562, a first NMOS transistor 565, a second NMOS transistor 595, plus a third NMOS transistor 575, and a fourth NMOS transistor 585. The drain of the first NMOS transistor 565, the drain of the first PMOS transistor 560 and the drain of the second PMOS transistor 562 are connected to each other forming the output node of the second NAND-gate 550.

The first PMOS transistor 560 and the second PMOS transistor 562 are connected to each other in parallel between the power supply voltage VDD and the output node of the second NAND-gate 550. The source of the first PMOS transistor 560 and the source of the second PMOS transistor 562 are connected to the power supply voltage VDD. The drain of the second PMOS transistor 562 is connected to the drain of the third PMOS transistor 560 at the output node of the second NAND-gate 550.

The first NMOS transistor 565, the second NMOS transistor 595, the third NMOS transistor 575, the fourth NMOS transistor 585 are connected to each other in series between the output node of the second NAND-gate 550 and the ground voltage. The drain of the third NMOS transistor 575 is connected to the source of the first NMOS transistor 565. The drain of the fourth NMOS transistor 585 is connected to the source of the third NMOS transistor 575. The drain of the second NMOS transistor 595 is connected to the source of the fourth NMOS transistor 585. The source of the second NMOS transistor 595 is connected to the ground voltage.

The gate of the first PMOS transistor 560 receives the internal power supply voltage INTVDD. Likewise, the gate of the first NMOS transistor 565, the gate of the third NMOS transistor 575, and the gate of the fourth NMOS transistor 585 receive the internal power supply voltage INTVDD.

The gate of the second PMOS transistor 562 and the gate of the second NMOS transistor 595 receive the inverted signal PDN_B of the power-down enable signal PDN.

The drain of the first PMOS transistor 560 and the drain of the second PMOS transistor 562 as the output of the second NAND-gate 550 are connected to the gate of a third power gating transistor 380. The second NAND-gate 550 performs a logical NAND operation upon the internal power supply voltage INTVDD and upon the inverted signal PDN_B of the power-down enable signal PDN, and provides the NAND output to the gate of the third power gating transistor 380.

Hereinafter the operation of the power gating circuit according to an exemplary embodiment of the present invention will be described with reference to FIG. 4 and FIG. 5.

When the power-down enable signal PDN that is applied to the power control pin 320 is "logic low", the first power gating transistor 360 is turned ON, and the inverted signal PDN_B of the power-down enable signal PDN is applied "logic high" to an input of each of the first and second NAND-gates 510 and 550. Since the first power gating transistor 360 is small, the peak current initially provided to the memory device 310 is small. The voltage level of the internal power supply voltage INTVDD increases to about 60% of a voltage level of the power supply voltage VDD due to the current through the first power gating transistor 360. When the increased voltage level of the internal power supply voltage INTVDD is higher than the logic threshold voltage of the first NAND-gate 510, the first NAND-gate 510 operates (outputs a "logic low") and the second (PMOS) power gating transistor 370 is turned ON.

The voltage level of the internal power supply voltage INTVDD typically is already higher than about 60% of the voltage level of the power supply voltage VDD when the second power gating transistor 370 is turned ON. Therefore, the turning ON of the second power gating transistor 370 has a smaller influence on the increase of the peak current. In addition, the voltage level of the internal power supply voltage INTVDD increases to about 90% of the voltage level of the power supply voltage VDD due to the current through the second power gating transistor 370. When the increased voltage level of the internal power supply voltage INTVDD is higher than the logic threshold voltage of the second NAND-gate 550, the second NAND-gate 550 operates (outputs a "logic low") and the third power gating transistor 380 is turned ON. The voltage level of the internal power supply voltage INTVDD is typically already higher than about 90% of the voltage level of the power supply voltage VDD when the third power gating transistor 380 is turned ON. Therefore, the turning ON of the third power transistor 380 that is bigger in size (than the first and second power transistors) hardly influences the increase of the peak current.

The pull-down stack of the first NAND-gate 510 includes two NMOS transistors 530 and 540 connected in series, and the pull-down stack of the second NAND-gate 550 includes four NMOS transistor 565, 575, 585, and 595, three of which (565, 575, 585) are commonly controlled. Thus, the logic threshold voltage of the second NAND-gate 510 is higher than the logic threshold voltage of the first NAND-gate 550. Therefore, the peak current that is applied to the memory device 310 can be reduced by dispersing the peak current.

The thick lines in FIG. 4 carry the internal power supply voltage INTVDD bus that is supplied to or internal in the memory device 310, and the thick lines are all connected to each other. The thick lines 365, 375 and 385 in FIG. 5 are all connected to each other as a bus and also carry the internal power supply voltage INTVDD that is supplied to the memory device 310.

Figure 1:
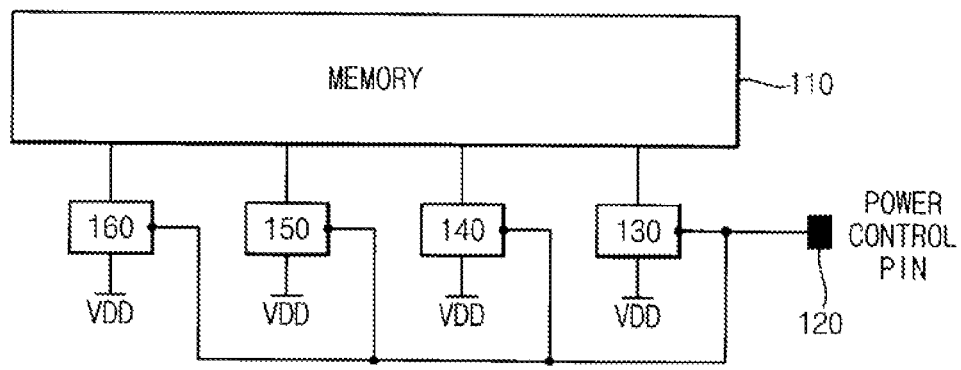
FIG. 1 is a block diagram illustrating a conventional power gating circuit for a memory device.
Figure 6:
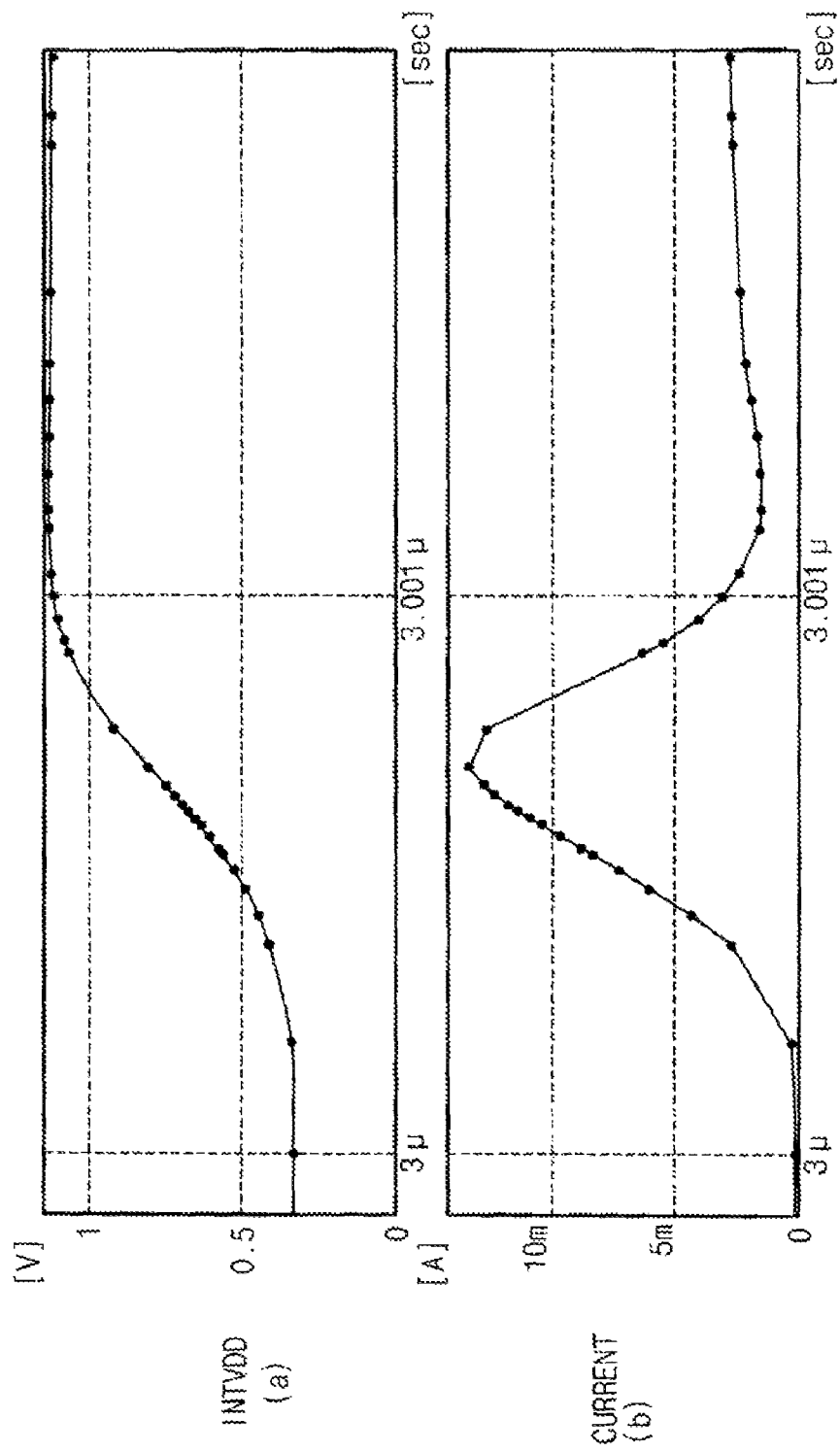
FIG. 6 is a graph of the result of a simulation of the conventional power gating circuit of FIG. 1 illustrating internal power supply voltage and peak current.

FIG. 6 is a graph of the result of a simulation of the conventional power gating circuit of FIG. 1 illustrating internal power supply voltage and peak current.

Figure 7:
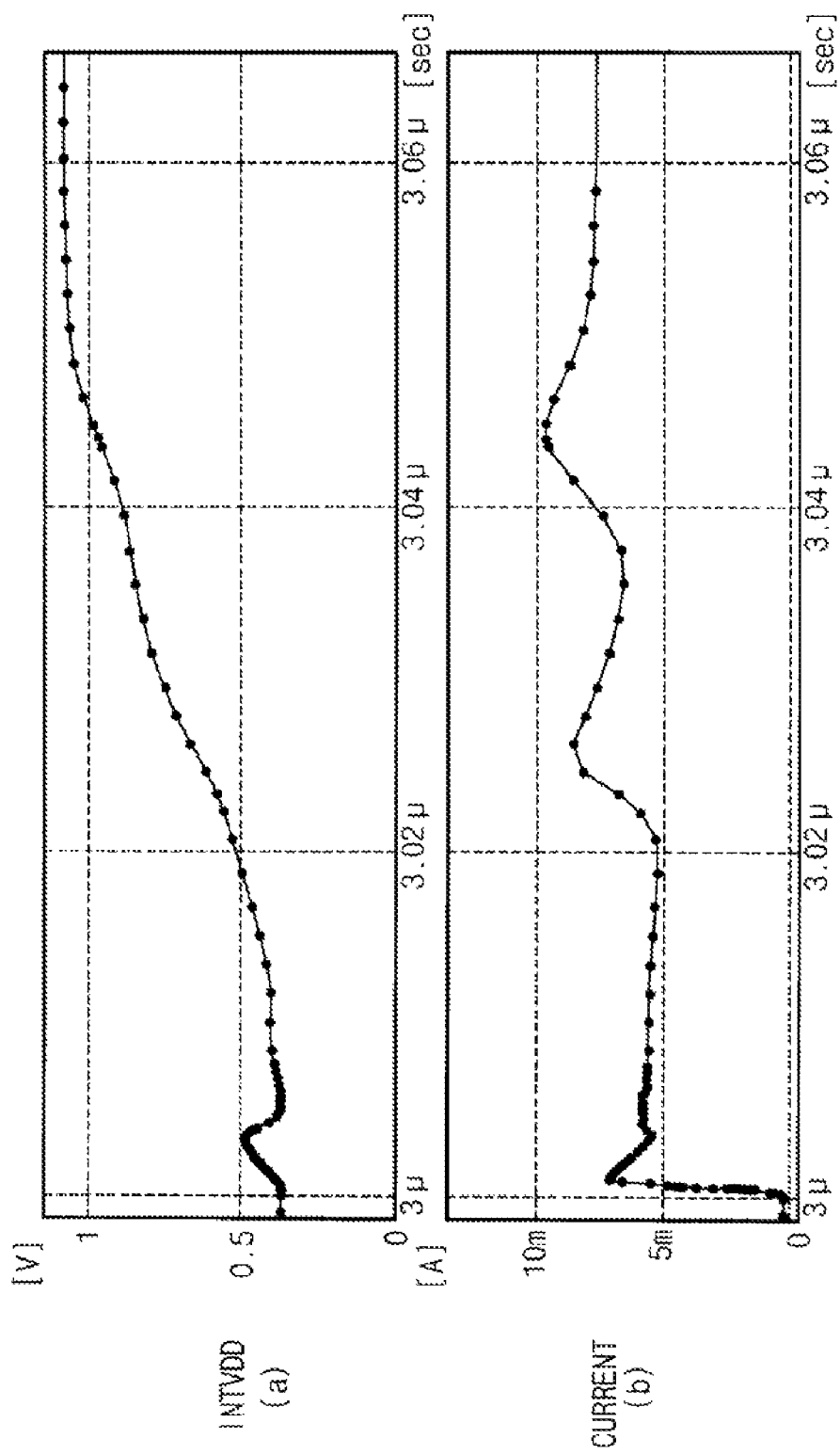
FIG. 7 is a graph of the result of a simulation of the power gating circuit of FIG. 3 illustrating internal power supply voltage and peak current.

FIG. 7 is a graph of the result of a simulation of the power gating circuit of FIG. 3 illustrating internal power supply voltage and peak current.

Referring to FIG. 6 and FIG. 7, the peak current is about 180 mA when the power gating circuit of FIG. 1 is used, and the peak current is about 10 mA when the power gating circuit of FIG. 3 is used. Thus, the peak current through the power gating circuit of FIG. 3 is about 10 times smaller than the peak current through the power gating circuit of FIG. 1.

Figure 8:
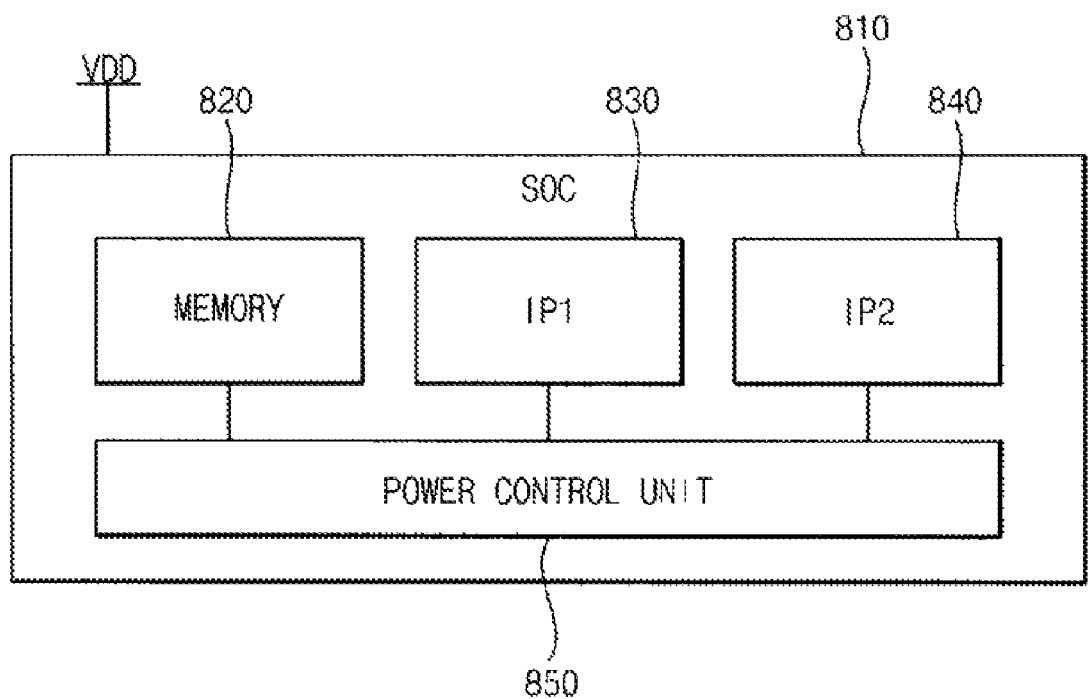
FIG. 8 is a block diagram of a system-on-a-chip circuit according to an exemplary embodiment of the present invention.

FIG. 8 is a block diagram of a system-on-a-chip circuit according to an exemplary embodiment of the present invention.

Referring to FIG. 8, the system-on-a-chip circuit 810 includes a memory device 820, a first and second intellectual properties (devices) 830 and 840 that may perform dedicated processing functions, and a power control unit 850. The power control unit 850 is connected to the memory device 820 and to the intellectual properties (devices) 830 and 840. In addition, the power control unit 850 controls the power that is supplied to the memory device 820 and to the intellectual properties (devices) 830 and 840. The power control unit 850 may include the power gating circuit of FIGS. 3, 4 and 5.

In accordance with exemplary embodiments of the present invention, a power gating circuit and a system-on-a-chip circuit including the power gating circuit can disperse the peak current by sequentially turning ON power gating transistors and gradually increasing the voltage level of an internal power supply voltage. The adverse influence of the peak current on adjacent devices ("intellectual properties") can be reduced, and the system-on-a-chip circuit can be implemented in smaller size.

In accordance with exemplary embodiments of the present invention, in a power gating method, the peak current can be dispersed by sequentially turning ON power gating transistors and gradually increasing the voltage level of an internal power supply voltage, and the influence of the peak current on adjacent devices can be reduced.

While the exemplary embodiments of the present invention and their advantages have been described in detail, it should be understood that various changes, substitutions and alterations may be made herein without departing from the scope of the invention. For example, it will be apparent to persons skilled in the art that the connection order of the first (530) and second (540) series-connected NMOS transistors in the first NAND-gate 510 shown in FIG. 4 can be reversed without materially affecting the operation of the first NAND-gate. Similarly, it will be apparent to persons skilled in the art that the connection order of the first, second, third and fourth series-connected NMOS transistors (565, 595, 575, 585) in the second NAND-gate 550 shown in FIG. 5 can be re-ordered without materially affecting the operation of the second NAND-gate 550.

Similarly, it will be apparent to persons skilled in the art that the second NMOS transistor (540, 595) of each of the first and second NAND-gates shown in FIG. 5 have the same control signal (PDN_B) and operate identically, and thus may be combined into one single NMOS transistor (540-595), reducing the transistor count of the circuit.

What is claimed is:

1. A power gating circuit for gradually increasing the voltage level of an internal power supply voltage bus to the voltage level of a power supply voltage VDD, comprising:
a power gating unit that includes first and second power gating transistors connected in parallel between the power supply voltage VDD and the internal power supply voltage bus,
wherein the first and second power gating transistors are configured to sequentially turn ON;
wherein the first power gating transistor is turned ON in response to a power-down enable signal;
wherein the second power gating transistor is turned ON in response to a first intermediate voltage level on the internal power supply voltage bus;
wherein the power gating unit further includes a third power gating transistor connected in parallel between the power supply voltage VDD and the internal power supply voltage bus;
wherein the first, second and third power gating transistors are configured to sequentially turn ON;
wherein the third power gating transistor is turned ON in response to a second intermediate voltage level on the internal power supply voltage bus; and
wherein the second intermediate voltage level is higher than the first intermediate voltage level, and the second intermediate voltage level is lower than the power supply voltage VDD.

2. The power gating circuit of claim 1, wherein each of the first power gating transistor, the second power gating transistor, and the third power gating transistor is a PMOS transistor.

3. The power gating circuit of claim 1, wherein the size of the first power gating transistor is smaller than the size of the second power gating transistor, and the size of the second power gating transistor is smaller than the size of the third power gating transistor.

4. The power gating circuit of claim 1, further comprising a control unit connected to the internal power supply voltage bus and to the power gating unit,
wherein the control unit includes a first logic gate configured to control a timing point when the second power gating transistor is turned ON.

5. The power gating circuit of claim 4, wherein the power gating unit further includes a third power gating transistor connected between the power supply voltage VDD and the internal power supply voltage bus;
wherein the control unit further includes a second logic gate configured to control a timing point when the third power gating transistor is turned ON; and
wherein the first, second, and third power gating transistors are configured to sequentially turn ON.

6. The power gating circuit of claim 5, wherein a logic threshold voltage of the first NAND-gate is lower than the logic threshold voltage of the second NAND-gate.

7. The power gating circuit of claim 6, wherein a logic threshold voltage of the first NAND-gate is lower than the logic threshold voltage of the second NAND-gate.

8. The power gating circuit of claim 6, wherein the gate of the first power gating transistor receives a power-down enable signal, the source of the first power gating transistor is connected to the power supply voltage VDD, and the drain of the first power gating transistor is connected to the internal power supply voltage bus.

9. The power gating circuit of claim 8, wherein the internal power supply voltage and an inverted power-down enable signal are inputs of the first NAND-gate;
wherein the gate of the second power gating transistor receives the output of the first NAND-gate;
wherein the internal power supply voltage and the inverted power-down enable signal are inputs of the second NAND-gate; and
wherein the gate of the third power gating transistor receives the output of the second NAND-gate.

10. The power gating circuit of claim 7, wherein the first NAND-gate includes:
a first PMOS transistor;
a second PMOS transistor;
a first NMOS transistor; and
a second NMOS transistor,
wherein the first PMOS transistor and the second PMOS transistor are connected in parallel between the power supply voltage and the output of the first NAND-gate, and the first NMOS transistor and the second NMOS transistor are connected in series between the output of the first NAND-gate and a ground voltage.

11. The power gating circuit of claim 10, wherein the gate of the first PMOS transistor receives the internal power supply voltage, and the source of the first PMOS transistor is connected to the power supply voltage;

wherein the gate of the second PMOS transistor receives the inverted power-down enable signal, the source of the second PMOS transistor is connected to the power supply voltage and to the source of the first PMOS transistor, and the drain of the second PMOS transistor is connected to the drain of the first PMOS transistor;

wherein the gate of the first NMOS transistor receives the internal power supply voltage; and wherein the gate of the second NMOS transistor receives the inverted power-down enable signal.

12. The power gating circuit of claim 11, wherein the drain of the first NMOS transistor is connected to the drain of the first PMOS transistor and to the drain of the second PMOS transistor; and the drain of the second NMOS transistor is connected to the source of the first NMOS transistor, and the source of the second NMOS transistor is connected to a ground voltage.

13. The power gating circuit of claim 6, wherein the second NAND-gate includes:
a first PMOS transistor;
a second PMOS transistor;
a first NMOS transistor;
a second NMOS transistor;
a third NMOS transistor; and
a fourth NMOS transistor,
wherein the first PMOS transistor and the second PMOS transistor are connected in parallel between the power supply voltage and the output of the second NAND-gate, and
wherein the first NMOS transistor, the second NMOS transistor, the third NMOS transistor, and the fourth NMOS transistor are connected in series between the output of the second NAND-gate and a ground voltage.

14. The power gating circuit of claim 13, wherein the gate of the first PMOS transistor receives the internal power supply voltage and the source of the third PMOS transistor is connected to the power supply voltage;

wherein the gate of the second PMOS transistor receives the inverted power-down enable signal, the source of the second PMOS transistor is connected to the power supply voltage and to the source of the first PMOS transistor, and the drain of the second PMOS transistor is connected to the drain of the first PMOS transistor;

wherein the gate of the first NMOS transistor receives the internal power supply voltage;

wherein the gate of the second NMOS transistor receives the inverted power-down enable signal;

wherein the gate of the third NMOS transistor receives the internal power supply voltage; and wherein the gate of the fourth NMOS transistor receives the internal power supply voltage.

15. The power gating circuit of claim 14, wherein:
the drain of the first NMOS transistor is connected to the drain of the first PMOS transistor and to the drain of the second PMOS transistor;
the drain of the third NMOS transistor is connected to the source of the first NMOS transistor;
the drain of the fourth NMOS transistor is connected to the source of the third NMOS transistor; and
the drain of the second NMOS transistor is connected to the source of the fourth NMOS transistor, and the source of the second NMOS transistor is connected to the ground voltage.

16. A power gating circuit, comprising: a terminal to which a power voltage is applied; a bus for providing an internal power supply voltage to at least one device; and a power gating unit that includes first, second and third power gating transistors connected in parallel between the terminal and the bus, wherein the second and third power gating transistors are sequentially turned ON in response to the voltage level of the bus;

wherein the first, second and third power gating transistors are configured to sequentially turn ON;

wherein the third power gating transistor is turned ON in response to a second intermediate voltage level on the internal power supply voltage bus; and wherein the second intermediate voltage level is higher than the first intermediate voltage level, and the second intermediate voltage level is lower than the power supply voltage VDD.

17. The power gating circuit of claim 16, further comprising:
a control unit connected to the bus and to the power gating unit, and configured to control the timing points when the second and third power gating transistors are sequentially turned ON based upon a gradually increasing voltage level on the bus.

* * * * *